(12) United States Patent
Behzad et al.

(10) Patent No.: US 7,697,915 B2
(45) Date of Patent: Apr. 13, 2010

(54) GAIN BOOSTING RF GAIN STAGE WITH CROSS-COUPLED CAPACITORS

(75) Inventors: Arya Behzad, Poway, CA (US); C. Paul Lee, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 671 days.

(21) Appl. No.: 11/167,358

(22) Filed: Jun. 27, 2005

(65) Prior Publication Data

US 2006/0057990 A1 Mar. 16, 2006

Related U.S. Application Data

(60) Provisional application No. 60/609,214, filed on Sep. 10, 2004.

(51) Int. Cl.
*H04B 1/10* (2006.01)
(52) U.S. Cl. ............... 455/311; 455/341; 330/253; 330/80

(58) Field of Classification Search ............... 455/296, 455/311, 341, 114.2; 330/253, 169, 177, 330/67, 76, 80
See application file for complete search history.

(56) References Cited

U.S. PATENT DOCUMENTS

| | | | |
|---|---|---|---|
| 4,291,246 A | 9/1981 | Martino et al. | |
| 6,414,517 B1 | 7/2002 | Kim et al. | |
| 6,538,513 B2 * | 3/2003 | Godfrey et al. | 330/258 |
| 6,737,920 B2 * | 5/2004 | Jen et al. | 330/254 |
| 7,015,870 B2 | 3/2006 | Guitton et al. | |
| 7,123,073 B2 * | 10/2006 | Nakatani et al. | 327/358 |
| 7,424,271 B2 | 9/2008 | Shih et al. | |
| 7,466,968 B2 | 12/2008 | Audinot | |
| 2004/0106380 A1 * | 6/2004 | Vassiliou et al. | 455/73 |

* cited by examiner

*Primary Examiner*—Edward Urban
*Assistant Examiner*—Christian A Hannon
(74) *Attorney, Agent, or Firm*—Stanton Braden

(57) ABSTRACT

A RF differential gain stage has cross-coupled capacitors between input and output nodes of the amplifier stage to boost gain. The gain boost allows cancellation of the series resistance of an inductive load of the amplifier stage.

18 Claims, 6 Drawing Sheets

GAIN BOOSTING RF GAIN STAGE WITH CROSS-COUPLED CAPACITORS

CROSS REFERENCE TO RELATED APPLICATION

This application claims the benefit of priority to U.S. Provisional Patent Application Ser. No. 60/609,214; filed Sep. 10, 2004; and titled "Gain Boosting RF Gain Stage With Cross-Coupled Capacitors," which is incorporated herein by reference.

BACKGROUND OF THE INVENTION

1. Technical Field of the Invention

The embodiments of the invention relate to communication devices and more particularly to RF amplifiers used within such communication devices.

2. Description of Related Art

Communication systems are known to support wireless and wire lined communications between wireless and/or wire lined communication devices. Such communication systems range from national and/or international cellular telephone systems to the Internet to point-to-point in-home wireless networks. Communication systems typically operate in accordance with one or more communication standards. For instance, wired communication systems may operate according to one or more versions of the Ethernet standard, the System Packet Interface (SPI) standard, or various other standards. Wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). Typically, the transceiver includes a data modulation stage and an RF stage. The data modulation stage (baseband process) converts between data and baseband signals in accordance with the particular wireless communication standard. The RF stage (transmitter section and receiver section) converts between baseband signals and RF signals. The RF stage may be a direct conversion transceiver that converts directly between baseband and RF or may include one or more intermediate frequency stages.

The RF stage or stages operate(s) upon RF signals, in differing channels and sub-bands of an allocated frequency band. Thus, filtering, amplifying, and signal conversion components of the RF stage operate acceptably at a variety of RF center frequencies. In many RF stages, the filtering, amplifying, and signal conversion components are tuned to operate at particular center frequencies, e.g., tuned RF circuits. By varying tuning control settings of the tuned RF circuits, the overall gain of the RF stage is optimized and power consumption is reduced. Gain boosting circuitry may be employed to control or boost gain in such RF stages.

One form of an RF stage is a differential amplifier using an inductive load, such as an inductor. Typically, it is desirable to obtain a high Q (measure of quality) for the inductor. However, because actual circuit inductors are not ideal inductors, there is a certain amount of resistance associated with the inductor. Generally, the effect of this resistance is a parallel resistance on the load of the amplifier stage, which may reduce the overall Q and/or the gain of the stage. Although active compensating circuitry may be implemented, the active component(s) may introduce noise, which may reduce the overall signal-to-noise ratio for the amplifier.

Accordingly, it would be advantageous to implement a gain boosting stage to overcome the resistance of the inductive load, in which the gain boosting is achieved with passive components.

SUMMARY OF THE INVENTION

The present invention is directed to apparatus and methods of operation that are further described in the following Brief Description of the Drawings, the Detailed Description of the Embodiments of the Invention, and the Claims. Other features and advantages related to the embodiments of the present invention will become apparent from the following detailed description of the embodiments of the invention made with reference to the accompanying drawings.

An apparatus and method to gain boost a RF amplifier stage with use of cross-coupled capacitors. The gain boost allows cancellation of a series resistance of an inductive load of the amplifier stage. In one embodiment a plurality of transistors are arranged as a cascode differential amplifier stage having inductors as loads. The amplifier stage has cross-coupled capacitors that reside between the input and output nodes to provide feedback to boost gain of the amplifier stage, but without turning the amplifier into an oscillator. In another embodiment, resistors are coupled in series with the cross-coupled capacitors for additional degree of freedom for selecting capacitance values for the cross-coupled capacitors. Furthermore, other embodiments employ a current source in a common leg of the amplifier stage to allow for tighter current flow control in the amplifier stage.

DETAILED DESCRIPTION OF THE EMBODIMENTS OF THE INVENTION

The embodiments of the present invention may be practiced in a variety of settings that implement a radio frequency (RF) amplifier stage.

Figure 1:
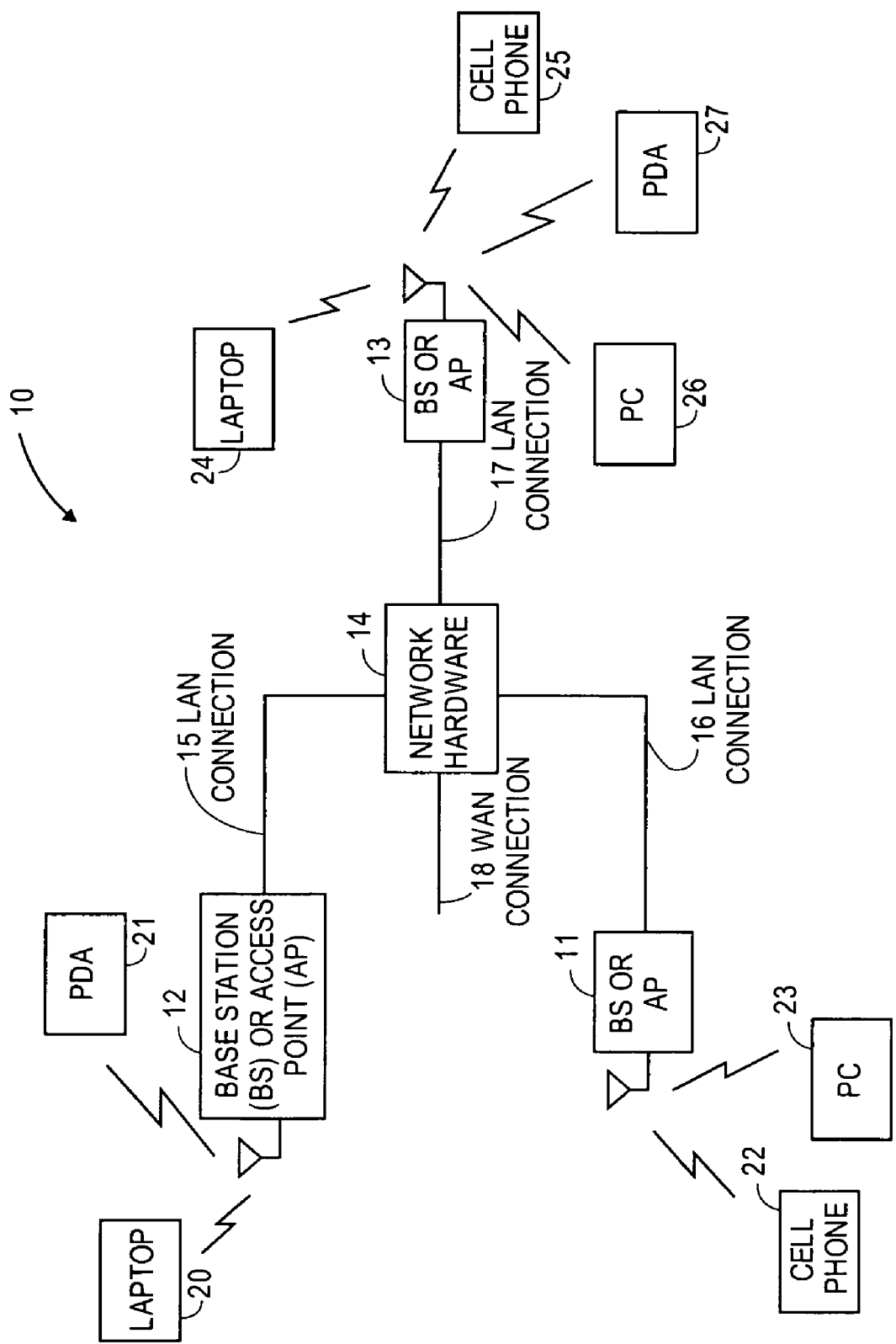
FIG. 1 is a block schematic diagram illustrating a wireless communication system in accordance with one embodiment of the present invention.

FIG. 1 is a schematic block diagram illustrating a communication system 10 that includes a plurality of base stations (BS) and/or access points (AP) 11-13, a plurality of wireless communication devices 20-27 and a network hardware component 14. Wireless communication devices 20-27 may be laptop host computers 20 and 24, personal digital assistant hosts 21 and 27, personal computer hosts 23 and 26, cellular telephone hosts 22 and 25, and/or any other type of device that supports wireless communications. The details of the wireless communication devices will be described with reference to FIG. 2.

Base stations or access points 11-13 may be operably coupled to network hardware 14 via respective local area network (LAN) connections 15-17. Network hardware 14, which may be a router, switch, bridge, modem, system controller, et cetera, may provide a wide area network (WAN) connection 18 for communication system 10. Individual base station or access point 11-13 generally has an associated antenna or antenna array to communicate with the wireless communication devices in its area. Typically, the wireless communication devices register with a particular base station or access point 11-13 to receive services within communication system 10. For direct connections (i.e., point-to-point communications), wireless communication devices may communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifiers and/or programmable multi-stage amplifiers to enhance performance, reduce costs, reduce size, and/or enhance broadband applications.

Figure 2:
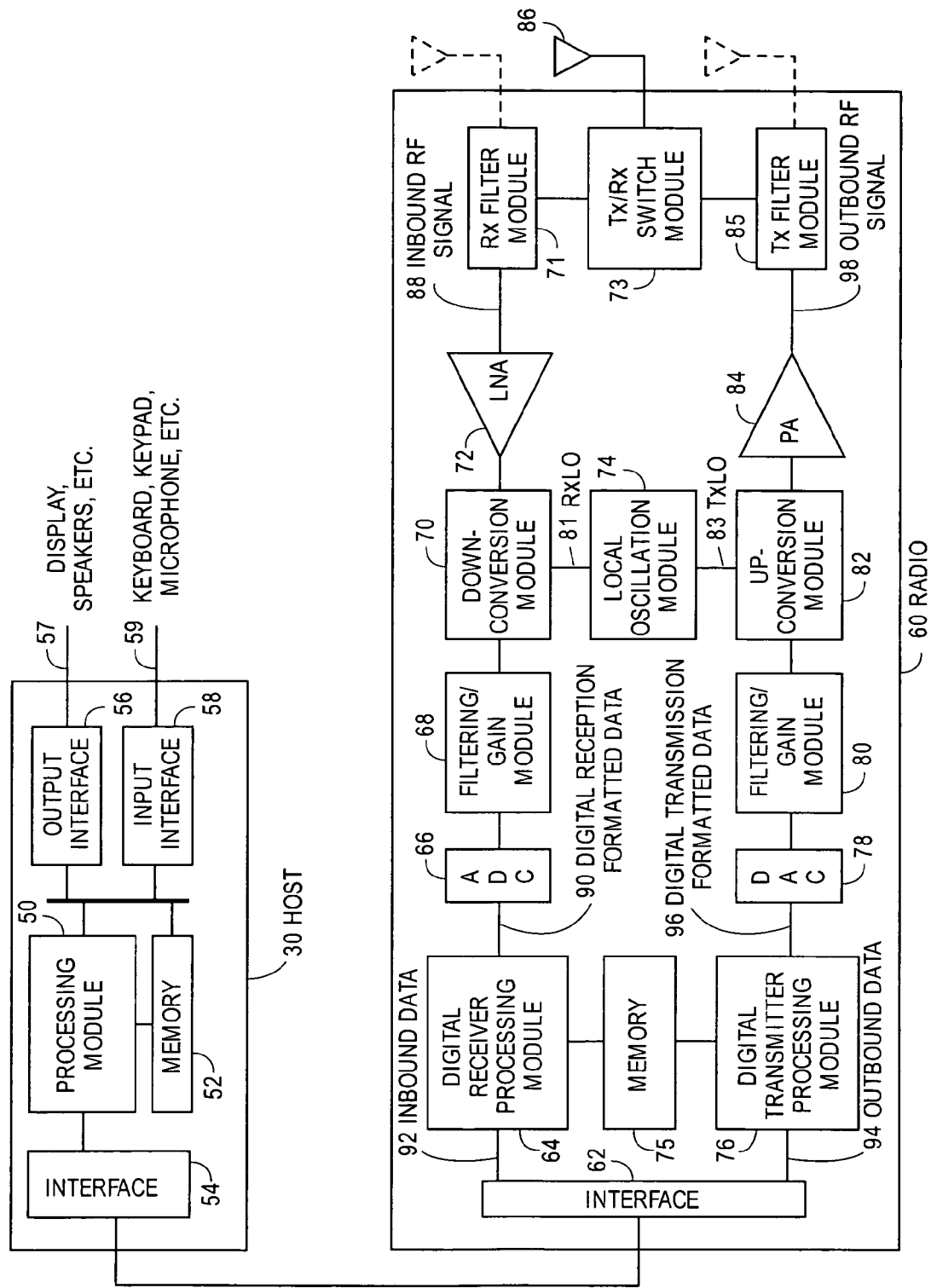
FIG. 2 is a schematic block diagram illustrating a wireless communication device in accordance with one embodiment of the present invention.

FIG. 2 is a schematic block diagram illustrating a wireless communication device that includes a host unit 30 and an associated radio unit 60. Host unit 30 may be incorporated in a communication device, such as one or more of the wireless communication devices 20-27 shown in FIG. 1. For cellular telephone hosts, radio 60 is typically a built-in component. For personal digital assistants hosts, laptop hosts, and/or personal computer hosts, radio 60 may be built-in or may be an externally coupled component that couples to host device 30 via a communication link, such as a PCI interface, PCMCIA interface, USB interface, or another type of interface.

As illustrated, host device 30 includes a processing module 50, memory 52, radio interface 54, input interface 58, and output interface 56. Processing module 50 and memory 52 execute corresponding instructions that are typically done by the host device. For example, for a cellular telephone host device, processing module 50 performs the corresponding communication functions in accordance with a particular cellular telephone standard.

Radio interface 54 allows data to be received from and sent to radio 60. For inbound data received from radio 60, radio interface 54 provides the data to processing module 50 for further processing and/or routing to output interface 56. Output interface 56 provides connectivity to an output display device 57, such as a display, monitor, speakers, et cetera, such that the received data may be displayed or otherwise output. Radio interface 54 also provides outbound data from processing module 50 to radio 60. Processing module 50 may receive the outbound data from an input device 59, such as a keyboard, keypad, microphone, et cetera, via input interface 58 or generate the data itself. For data received via input interface 58, processing module 50 may perform a corresponding host function on the data and/or route it to radio 60 via radio interface 54.

Radio 60 includes a host interface 62, a digital receiver processing module 64, an analog-to-digital converter (ADC) 66, a filtering/gain/attenuation module 68, an intermediate frequency (IF) mixing down conversion stage noted as down-conversion module 70, a receiver filter module 71, a low noise amplifier (LNA) 72, a transmitter/receiver (Tx/Rx) switch module 73, a local oscillation module 74, a memory 75, a digital transmitter processing module 76, a digital-to-analog converter (DAC) 78, a filtering/gain/attenuation module 80, an IF mixing up conversion stage noted as up-conversion module 82, a power amplifier (PA) 84, a transmitter filter module 85, and an antenna 86. The antenna 86 may be a single antenna that is shared by the transmit and receive paths as controlled by Tx/Rx switch 73, or may include separate antennae for the transmit path and receive path (shown by the dotted line). The antenna implementation may depend on the particular standard to which the wireless communication device is compliant.

Digital receiver processing module 64 and digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. Digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions.

Memory 75 may be a single memory device or a plurality of memory devices. Such a memory device may be a read-only memory, random access memory, volatile memory, non-volatile memory, static memory, dynamic memory, flash memory, and/or any device that stores digital information.

Note that when processing module 64 and/or 76 implements one or more of its functions via a state machine, analog circuitry, digital circuitry, and/or logic circuitry, the memory storing the corresponding operational instructions may be embedded with the circuitry comprising the state machine, analog circuitry, digital circuitry, and/or logic circuitry. Memory 75 stores, and the processing module 64 and/or 76 executes, operational instructions that facilitate functionality of the device. In some embodiments, the combination of digital receiver processing module 64, digital transmitter processing module 76 and memory 75 may be referred to together as a "baseband processor."

In operation, radio 60 receives outbound data 94 from host 30 via host interface 62. Host interface 62 routes outbound data 94 to digital transmitter processing module 76, which processes outbound data 94 in accordance with a particular wireless communication standard (e.g., IEEE802.11a, IEEE802.11b, IEEE802.11g, Bluetooth, et cetera) to produce digital transmission formatted data 96. Digital transmission formatted data 96 is typically a digital base-band signal or a digital low IF signal, where the low IF typically may be in the frequency range of one hundred kilohertz to a few megahertz (MHz).

Digital-to-analog converter 78 converts digital transmission formatted data 96 from the digital domain to the analog domain. Filtering/gain/attenuation module 80 filters and/or adjusts the gain of the analog signal prior to providing it to up-conversion module 82 for mixing. Up-conversion module 82 directly converts the analog baseband or low IF signal into an RF signal based on a transmitter local oscillation (Tx LO) 83 provided by local oscillation module 74. Power amplifier 84 amplifies the RF signal to produce outbound RF signal 98, which is filtered by transmitter filter module 85. Antenna 86 propagates outbound RF signal 98 to a targeted device such as a base station, an access point and/or another wireless communication device.

Radio 60 also receives inbound RF signal 88 via antenna 86, which was transmitted by a base station, an access point, or another wireless communication device. Antenna 86 provides inbound RF signal 88 to receiver filter module 71 via Tx/Rx switch 73, where Rx filter 71 bandpass filters inbound RF signal 88. Rx filter 71 provides the filtered RF signal to low noise amplifier 72, which amplifies signal 88 to produce an amplified inbound RF signal. The low noise amplifier 72 provides the amplified inbound RF signal to down-conversion module 70, which directly converts the amplified inbound RF signal into an inbound low IF signal or baseband signal based on a receiver local oscillation (Rx LO) 81 provided by local oscillation module 74. Down-conversion module 70 provides the inbound low IF signal or baseband signal to filtering/gain/attenuation module 68. Filtering/gain/attenuation module 68 may be implemented to filter and/or attenuate the inbound low IF signal or the inbound baseband signal to produce a filtered inbound signal.

Analog-to-digital converter 66 converts the filtered inbound signal from the analog domain to the digital domain to produce digital reception formatted data 90. Digital receiver processing module 64 decodes, descrambles, demaps, and/or demodulates digital reception formatted data 90 to recapture inbound data 92 in accordance with the particular wireless communication standard being implemented by radio 60. Host interface 62 provides the recaptured inbound data 92 to host device 30 via radio interface 54.

As one of ordinary skill in the art will appreciate, the particular wireless communication device of FIG. 2 may be implemented using one or more integrated circuits. For example, host 30 may be implemented on one integrated circuit and digital receiver processing module 64, digital transmitter processing module 76 and memory 75 may be implemented on a second integrated circuit, and the remaining components of radio 60, less the antenna 86, may be implemented on a third integrated circuit. As an alternative embodiment, radio 60 may be implemented on a single integrated circuit. As yet another alternative embodiment, processing module 50 of host 30 and digital receiver and transmitter processing modules 64 and 76 may be a common processing device implemented on a single integrated circuit. Further, memory 52 and memory 75 may be implemented on a single integrated circuit and/or on the same integrated circuit as the common processing modules of processing module 50 and digital receiver and transmitter processing module 64 and 76.

Figure 3:
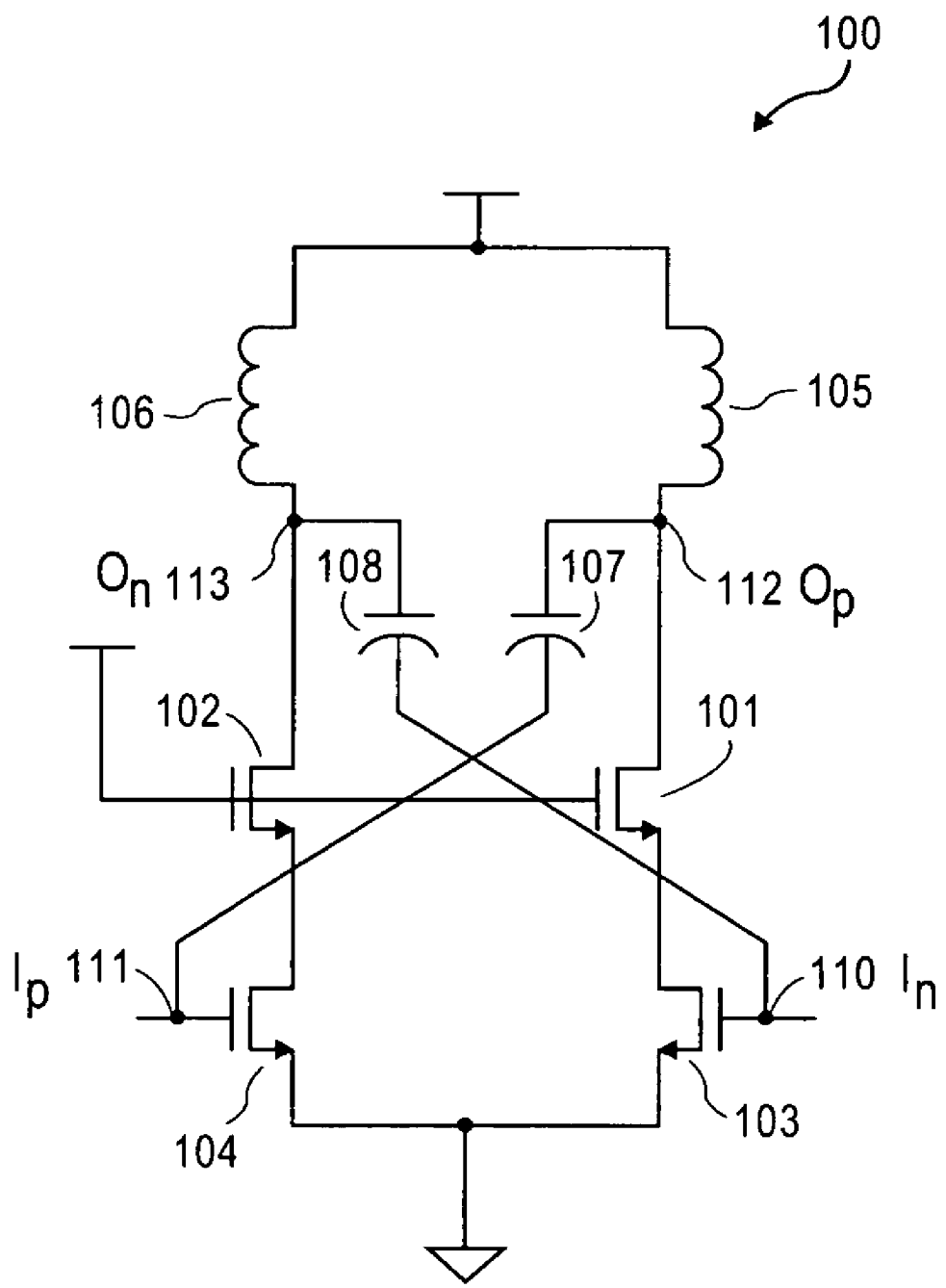
FIG. 3 a schematic circuit diagram of one embodiment of the invention in which cross-coupled capacitors are used for gain boosting in a differential radio frequency (RF) amplifier stage employing inductive loads.

FIG. 3 shows a schematic circuit diagram of one embodiment of the invention in which cross-coupled capacitors are used for gain boosting a radio frequency (RF) amplifier stage or stages. A RF amplifier stage 100 is shown having a plurality of transistors 101, 102, 103, 104. In the particular embodiment shown, transistors 101-104 are disposed in a cascode arrangement, so that amplifier stage 100 operates as a differential cascode amplifier. Transistors 103, 104 are input transistors for respective differential input signals, shown as $I_n$ (negative differential input) and $I_p$ (positive differential input). The differential input signals are coupled to gates of transistors 103, 104 at input node 110 for $I_n$ and at input node 111 for $I_p$. Differential output signals ($O_p$ and $O_n$) are obtained at corresponding output nodes 112, 113.

Transistors 101 and 102 are cascode transistors, having their gates coupled to a reference bias voltage, which may be a supply voltage. Transistors 101, 103 are arranged serially between output node 112 and a common leg of the differential stage that is coupled to a supply node, which in this instance is supply ground. Transistors 102, 104 are arranged serially between output node 113 and the common leg. In the particular embodiment shown in FIG. 3, transistors 101-104 are n-type transistors, so that the sources of transistors 103, 104 are coupled to the common leg and output nodes 112, 113 are obtained at the drains of respective transistors 112, 113. It is to be noted that an equivalent circuit may be designed using p-type transistors.

Amplifier stage 100 also includes inductive loads coupled to the output nodes 112, 113. A variety of inductive loads may be used. In the particular embodiment shown, inductors 105 and 106 form the inductive loads for amplifier stage 100. Inductors 105, 106 may form part of a tuned circuit for amplifier stage 100. The other side of inductors 105, 106 are shown coupled to a supply rail, but it is to be noted that other components may reside between inductors 105, 106 and the supply rail.

A cross-coupled capacitor network comprised of capacitors 107, 108 is disposed within amplifier stage 100. Capacitor 107 is disposed between nodes 111 and 112. Likewise, capacitor 108 is disposed between nodes 110 and 113. Cross-coupled capacitors 107, 108 function as feed-forward capacitors to provide positive gain feedback of $O_p$ to $I_p$ and $O_n$ to $I_n$. The gain boost obtained from the cross-coupling improves gain for the differential signals and this gain boost operates as though a negative resistance is introduced to offset (or to compensate) for the resistance of the inductive load. That is, the result obtained is analogous to reducing the series resistance of the inductors 105, 106, which may result in a higher Q value for the amplifier stage 100. The higher Q is obtained without introducing an active device to boost the gain, since the gain boost is obtained by the passive components, in this case capacitors 107, 108. The gain boost may also result in increasing the rejection of the common-mode signals.

The amount of the feedback may vary depending on the particular circuit employed. Thus, various capacitor sizes may be chosen. However, an important factor to consider is that the circuit is to operate as an amplifier and not as an oscillator. Since reactance is present with the inductors and capacitors, the cross-coupled capacitor value is selected so that the overall loop gain is not positive. That is, the cross-coupled capacitors boost the gain of the stage, but the gain is limited to a value which does not completely cancel all of the resistance of the inductors. Canceling all of the inductive load resistance may cause a positive loop gain condition that may turn the amplifier stage into an oscillator. Generally, the amplifier stage is to operate as an amplifier (not as an oscillator) over its PVT (process, voltage and temperature).

Some considerations for selecting a proper capacitance value for the cross-coupled capacitors are: size of transistors 103, 104 and/or 101, 102; value of the inductive load (inductors 105, 106); series resistance of the inductor; trace resistance which may add to the series resistance; negative resistance desired; and what circuit is to be driven in the next stage. One or more of these factors, as well as others which are not listed here, may play in the consideration for the value selected for capacitors 107, 108.

It is to be noted that another embodiment of the invention is to employ amplifier stage 100 without the use of cascode transistors 101, 102. In that event, output nodes 112, 113 may be obtained at the respective drains of the input transistors 103, 104. Although this design may be operative as an amplifier stage, the presence of cascode transistors 101, 102 improves performance of the stage.

Figure 4:
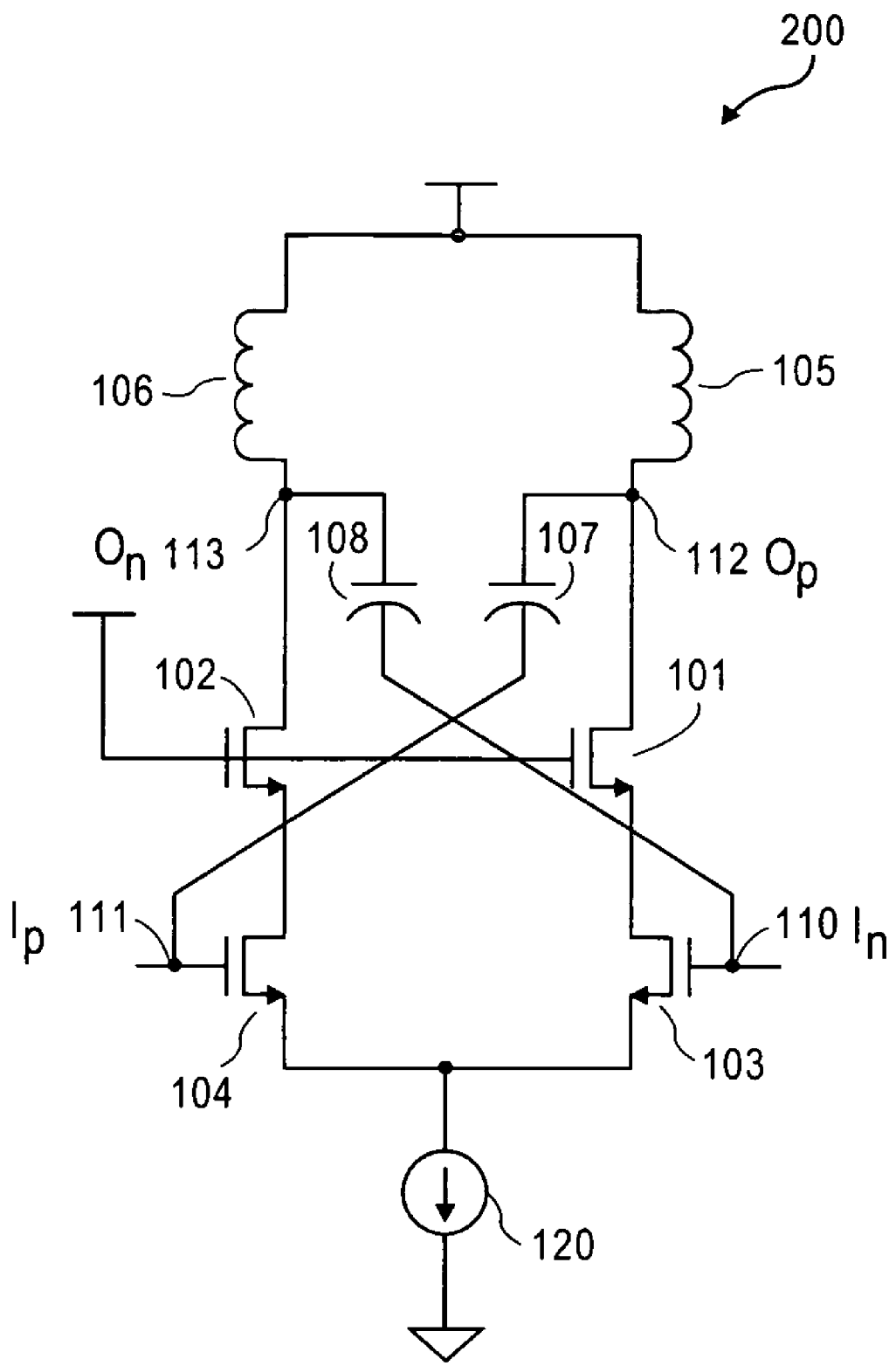
FIG. 4 a schematic circuit diagram of another embodiment of the amplifier stage of FIG. 3, in which a substantially constant current source is employed in a common leg of the amplifier stage.

FIG. 4 shows another embodiment of the invention. Amplifier stage 200 of FIG. 4 is equivalent to amplifier stage 100 of FIG. 3, except that now a current source 120 is introduced in the common leg of transistors 103, 104. Whereas amplifier stage 100 may be readily used in class A, B and AB modes of operation, it may have difficulty maintaining class A operation. Current source 120 of stage 200 provides a much tighter control on the current flow to the transistors, so that class A or linear mode of operation is readily easier to obtain. Furthermore, it is to be noted that the use of a current source is beneficial for common mode rejection. A variety of components which generally may be used to control current, may be used for current source 120.

Figure 5:
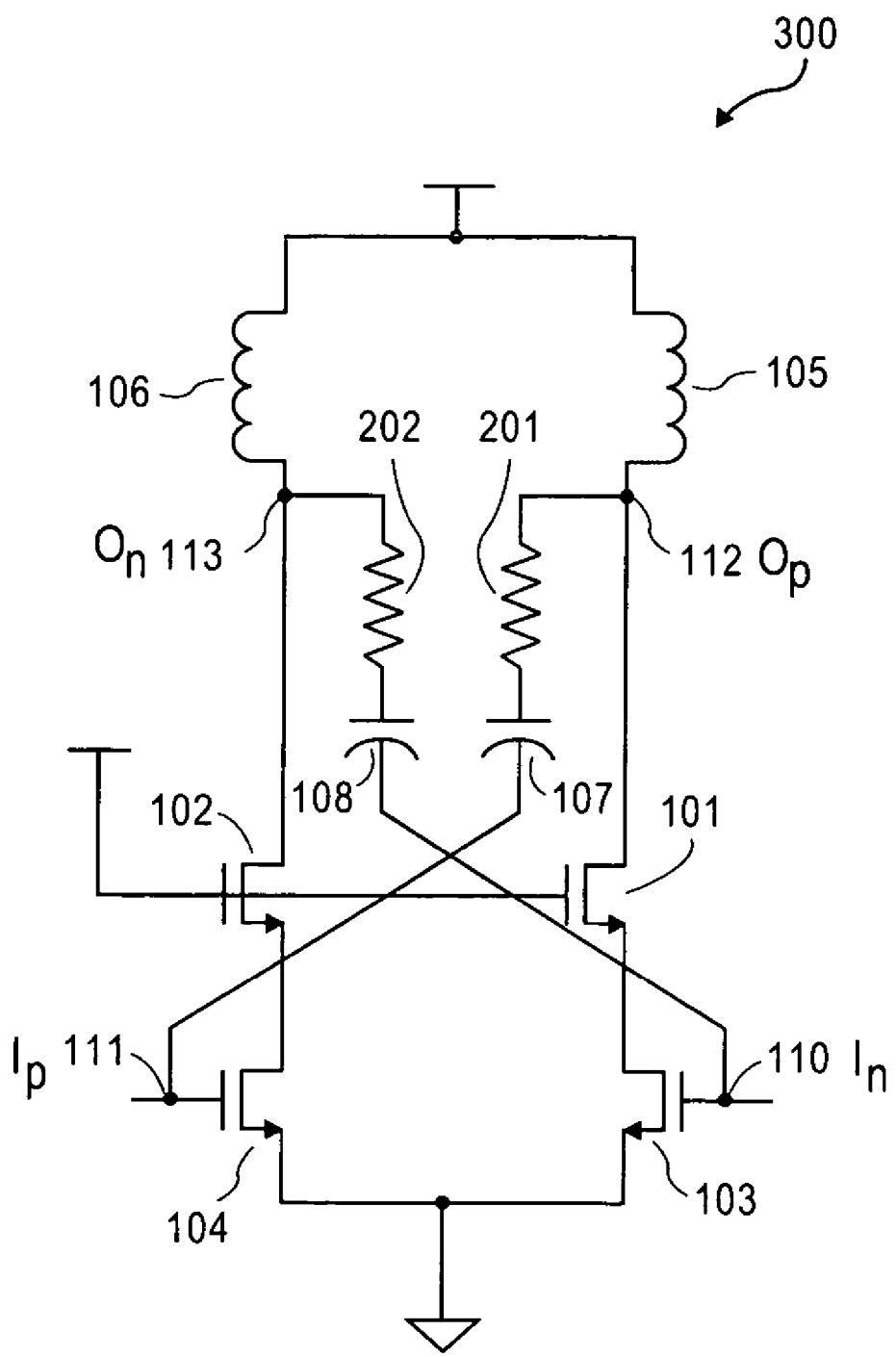
FIG. 5 a schematic circuit diagram of another embodiment of the invention in which cross-coupled capacitors with series resistance are used for gain boosting in a differential radio frequency (RF) amplifier stage employing inductive loads.

FIG. 5 shows another embodiment of the invention. Amplifier stage 300 of FIG. 5 is equivalent to amplifier stage 100 of FIG. 3, except that now respective resistance, shown as resistors 201, 202, are placed in series with corresponding capacitors 107, 108. The inclusion of resistors 201, 202 in the cross-coupled network with capacitors 107, 108 provides an additional degree of freedom to control feedback loop. Instead of having just control over the capacitance, now an RC combination is available in establishing the loop gain.

For example, a larger capacitance may be selected for capacitors 107, 108 and buffered through the resistors 210, 202 to prevent the amplifier stage from entering into oscillation. In some instances, stage 100 or 200 may be difficult to use if impedance matching is a concern. For example, if the amplifier stage is a stand alone stage or is at the beginning or end of a multiple set of amplifier stages, it may be beneficial to use amplifier stage 300 if impedance matching is needed. The degree of freedom obtained by selecting the RC combination allows impedance matching adjustments to be made, along with the gain boost.

Figure 6:
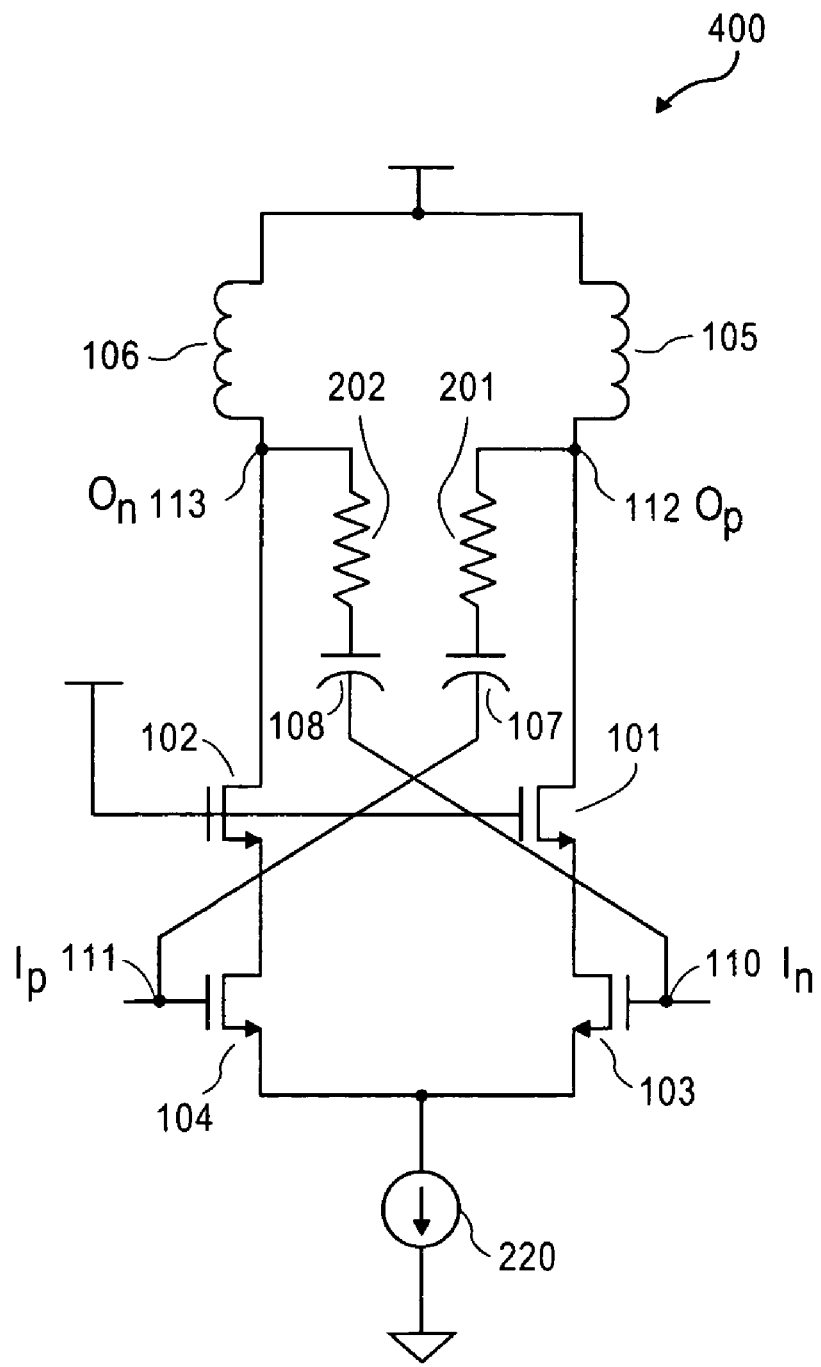
FIG. 6 a schematic circuit diagram of another embodiment of the amplifier stage of FIG. 4, in which a substantially constant current source is employed in a common leg of the amplifier stage.

FIG. 6 shows another embodiment of the invention. Amplifier stage 400 of FIG. 6 is equivalent to amplifier stage 300 of FIG. 5, except that now a current source 220 is introduced in the common leg of transistors 103, 104. As noted above in reference to current source 120 of FIG. 4, current source 220 provides a much tighter control on the current to the transistors, so that class A mode of operation is readily easier to obtain than stage 300.

It is to be noted that amplifier stage 100, 200, 300, 400 may be employed as RF amplifier stage(s) in various RF amplifier designs and may be employed in one or more of the components shown in FIGS. 1 and 2. For example, amplifier stage(s) 100, 200, 300, 400 may be employed in local oscillation module 74, up-conversion module 82, down-conversion module 70, PA 84 and/or LNA 72.

Thus, gain boosting RF gain stage with cross-coupled capacitors is described.

We claim:

1. An apparatus comprising:
a differentially arranged radio frequency (RF) amplifier stage having a first input node and a first output node associated with a first amplification branch of the differentially arranged RF amplifier stage, in which a first input transistor and a first cascode transistor are coupled in series between the first output node and a common leg of the RF amplifier stage, and a second input node and a second output node associated with a second amplification branch of the differentially arranged RF amplifier stage, in which a second input transistor and a second cascode transistor are coupled in series between the second output node and the common leg of the RF amplifier stage, the amplifier stage also having a first inductive load coupled to the first output node and a second inductive load coupled to the second output node; and
a cross-coupled capacitor network, having a first capacitor coupled between a gate of the first input transistor at the first input node and a drain of the second cascode transistor at the second output node and a second capacitor coupled between a gate of the second input transistor at the second input node and a drain of the first cascode transistor at the first output node, to provide gain boost of an input signal to the RF amplifier stage.

2. The apparatus of claim 1 wherein the first capacitor is coupled to a positive input node at the gate of the first input transistor and the second capacitor is coupled to a negative input node at the gate of the second input transistor.

3. The apparatus of claim 1 further including a current source coupled to the common leg of the differentially arranged RF amplifier stage to control current flow in the RF amplifier stage.

4. The apparatus of claim 1 wherein the cross-coupled capacitor network includes cross-coupled resistors in the network.

5. The apparatus of claim 1 wherein the cross-coupled capacitor network includes a first resistor in series with the first capacitor and a second resistor in series with the second capacitor.

6. The apparatus of claim 5 further including a current source coupled to the common leg of the RF amplifier stage to control current flow in the RF amplifier stage.

7. A radio frequency (RF) amplifier comprising:
a plurality of transistors arranged as a differential amplifier stage in which differential input signals are to be received on corresponding first and second input nodes, the differential amplifier stage having the first input node and a first output node associated with a first amplification branch, in which a first input transistor and a first cascode transistor are coupled in series between the first output node and a common leg of the differential amplifier stage, and the second input node and a second output node associated with a second amplification branch, in which a second input transistor and a second cascode transistor are coupled in series between the second output node and the common leg of the differential amplifier stage;

a pair of inductors coupled between the corresponding first and second output nodes and a supply node to operate as inductive loads for the transistors; and a cross-coupled pair of capacitors in which a first capacitor is coupled between a gate of the first input transistor at the first input node and a drain of the second cascode transistor at the second output node of the differential amplifier stage and a second capacitor is coupled between a gate of the second input transistor at the second input node and a drain of the first cascode transistor at the first output node of the differential amplifier stage, the cross-coupled pair of capacitors to provide feedback to boost gain of the differential amplifier stage to compensate for resistance of the inductors, but without putting the differential amplifier stage into oscillation.

8. The apparatus of claim 7 wherein the differential amplifier stage is employed in a local oscillator which is used to convert RF signals.

9. The apparatus of claim 7 wherein the differential amplifier stage is employed in one or more amplifier stage or stages of a wireless device.

10. The apparatus of claim 7 further including a current source coupled to the common leg coupling the first and second input transistors to control current flow in the differential amplifier stage to have the differential amplifier stage operate in a linear mode.

11. The apparatus of claim 7 further including a first resistance coupled in series with the first capacitor and a second resistance coupled in series with the second capacitor.

12. The apparatus of claim 11 further including a current source coupled to the common leg coupling the first and second input transistors to control current flow in the differential amplifier stage to have the differential amplifier stage operate in a linear mode.

13. The apparatus of claim 11 in which the first resistance and the second resistance are to allow for impedance matching adjustment when the differential amplifier stage is employed as a first stage or a last stage of a multiple stage RF amplifier.

14. A method comprising:
inputting differential input signals to a differentially arranged radio frequency (RF) amplifier stage having an inductive load and cross-coupled capacitors, wherein the differentially arranged RF amplifier has a first input node and a first output node associated with a first amplification branch of the differentially arranged RF amplifier stage, in which a first input transistor and a first cascode transistor are coupled in series between the first output node and a common leg of the RF amplifier stage, and a second input node and a second output node associated with a second amplification branch of the differentially arranged RF amplifier stage, in which a second input transistor and a second cascode transistor are coupled in series between the second output node and the common leg of the RF amplifier stage, and wherein the cross-coupled capacitors include a first capacitor coupled between a gate of the first input transistor at the first input node and a drain of the second cascode transistor at the second output node and a second capacitor coupled between a gate of the second input transistor at the second input node and a drain of the first cascode transistor at the first output node;

using the cross-coupled capacitors to provide feedback to boost gain of the differentially arranged RF amplifier stage to compensate for resistance of the inductive load, but without putting the differentially arranged amplifier stage into oscillation; and outputting differential output signals from the differentially arranged RF amplifier stage.

15. The method of claim 14 wherein the inputting of the differential input signals includes inputting the differential input signals onto corresponding gate terminals of the first and second input transistors.

16. The method of claim 15 wherein the outputting of the differential output signals is controlled by a substantially constant current source in the common leg of the differential RF amplifier stage.

17. The method of claim 15 wherein using the cross-coupled capacitors includes using cross-coupled capacitors that have a first resistance coupled in series with the first capacitor and a second resistance coupled in series with the second capacitor.

18. The method of claim 17 wherein the outputting of the differential output signals is controlled by a substantially constant current source in the common leg of the differential RF amplifier stage.

* * * * *